United States Patent
Yang et al.

(10) Patent No.: US 9,461,489 B2
(45) Date of Patent: Oct. 4, 2016

(54) MOBILE COMMUNICATION TERMINAL

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Jiuxia Yang, Beijing (CN); Feng Bai, Beijing (CN); Jiaheng Wang, Beijing (CN)

(73) Assignees: BOE Technology Group Co., Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 14/422,304

(22) PCT Filed: Jul. 25, 2014

(86) PCT No.: PCT/CN2014/083068
§ 371 (c)(1),
(2) Date: Feb. 18, 2015

(87) PCT Pub. No.: WO2015/090066
PCT Pub. Date: Jun. 25, 2015

(65) Prior Publication Data
US 2016/0013671 A1 Jan. 14, 2016

(30) Foreign Application Priority Data

Dec. 19, 2013 (CN) .......................... 2013 1 0703483

(51) Int. Cl.
*H02J 7/00* (2006.01)
*H01L 35/32* (2006.01)
(Continued)

(52) U.S. Cl.
CPC ............. *H02J 7/0042* (2013.01); *H01L 35/02* (2013.01); *H01L 35/32* (2013.01); *H02J 7/32* (2013.01); *H02J 7/34* (2013.01); *Y02B 40/90* (2013.01)

(58) Field of Classification Search
CPC ....... H01L 35/00; H01L 35/02; H01L 35/32; H02J 7/0042; H02J 7/32; H02J 7/34; Y02B 40/90
USPC ........................................... 455/573; 320/101
See application file for complete search history.

(56) References Cited

U.S. PATENT DOCUMENTS 7,843,691 B2 * 11/2010 Reichert ................. G06F 1/203
165/104.33
2007/0155424 A1 * 7/2007 Gasper ................ H04M 1/0202
455/556.1
(Continued)

FOREIGN PATENT DOCUMENTS

CN 201199730 Y 2/2009
CN 101588079 A 11/2009
(Continued)

OTHER PUBLICATIONS

Chinese Office Action of Chinese Application No. 201310703483.7, mailed Mar. 18, 2015 with English translation.
(Continued)

*Primary Examiner* — Raymond Dean
(74) *Attorney, Agent, or Firm* — Collard & Roe, P.C.

(57) ABSTRACT

A mobile communication terminal, comprises: a thermoelectric conversion unit comprising a conversion device for converting heat energy into electric energy; and an energy storage unit electrically connected to the conversion device and configured to store the electric energy generated by the conversion device. The mobile communication terminal can solve the problem that existing mobile communication terminals have large power consumption and short continuous service time, take full advantage of energies, and extend the continuous service time of the mobile communication terminal.

18 Claims, 1 Drawing Sheet

(51) Int. Cl.
    *H02J 7/32*     (2006.01)
    *H01L 35/02*     (2006.01)
    *H02J 7/34*     (2006.01)

(56) References Cited

U.S. PATENT DOCUMENTS

| | | | |
|---|---|---|---|
| 2009/0014047 A1* | 1/2009 | Span | H01L 35/08 136/204 |
| 2009/0260668 A1* | 10/2009 | Maeda | H02J 7/34 136/205 |
| 2012/0312343 A1* | 12/2012 | VanVechten | H01L 35/22 136/201 |
| 2014/0340376 A1 | 11/2014 | Itagaki et al. | |

FOREIGN PATENT DOCUMENTS

| | | |
|---|---|---|
| CN | 202759400 U | 2/2013 |
| CN | 103107745 A | 5/2013 |
| CN | 103246098 A | 8/2013 |
| CN | 103391025 A | 11/2013 |
| CN | 103701186 A | 4/2014 |
| EP | 2 835 904 A1 | 2/2015 |
| JP | 11128091 * | 5/1999 |
| WO | 2013/042505 A1 | 3/2013 |

OTHER PUBLICATIONS

International Search Report and Written Opinion of the International Searching Authority with Notice of Transmittal of the International Search Report and Written Opinion of PCT/CN2014/083068 in Chinese, mailed Oct. 27, 2014.

English translation of the International Preliminary Report on Patentability and Written Opinion of the International Searching Authority of PCT/CN2014/083068, issued Jun. 21, 2016.

* cited by examiner

MOBILE COMMUNICATION TERMINAL

CROSS REFERENCE TO RELATED APPLICATIONS

This application is the National Stage of PCT/CN2014/083068 filed on Jul. 25, 2014, which claims priority under 35 U.S.C. §119 of Chinese Application No. 201310703483.7 filed on Dec. 19, 2013, the disclosure of which is incorporated by reference.

TECHNICAL FIELD OF THE DISCLOSURE

The present disclosure relates to a mobile communication terminal.

BACKGROUND

With the development of technologies, current mobile communication terminals (such as cell phones, tablet computers, and so on) have had very broad applications.

Because all mobile communication terminals are powered by batteries, their continuous service time is limited. When the battery is used up, it has to be charged. However, frequent charging operations disturb the user's normal usage. More seriously, if the user forgets to charge the device, the problem that the device is not usable may be caused.

In particular, with the popularization of smart phones, the above problems become more notable. Smart phones have larger power consumption though they have more functions, but the energy storage capacity of batteries cannot be increased unlimitedly such that the smart phones have shorter continuous service time. Usually, many smart phones need to be charged every one or two days, which degrades users' usage experience dramatically.

SUMMARY

In view of the problem that existing mobile communication terminals have large power consumption and short continuous service time, there is provided a mobile communication terminal which can take full advantage of energies and has long continuous service time.

According to one aspect of the present disclosure, there is provided a mobile communication terminal comprising: a thermoelectric conversion unit comprising a conversion device for converting heat energy into electric energy; and an energy storage unit electrically connected to the conversion device and configured to store the electric energy generated by the conversion device.

In one exemplary embodiment, the conversion device comprises a plurality of superposed carbon nano-tube films, and the areas of the carbon nano-tube films become smaller gradually in the direction perpendicular to the surfaces of the carbon nano-tube films.

Further, in an exemplary embodiment, the thermoelectric conversion unit further comprises a heat source plate in contact with an outermost carbon nano-tube film, the heat source plate is used for transferring heat energy to the conversion device.

Further, in an exemplary embodiment, openings for airflow passing through are provided on the heat source plate.

In an exemplary embodiment, the conversion device comprises at least one thermoelectric generation (electric generation by temperature difference) device (referred to as thermoelectric generator hereafter), each of which comprises a first material and a second material electrically connected at one end, wherein the first material and the second material are materials that can generate Seebeck effect.

Further, in an exemplary embodiment, the thermoelectric conversion unit further comprises a heat source plate in contact with the electrically connected ends of the first material and the second material in the thermoelectric generator, and the heat source plate is configured to transfer heat energy to the conversion device.

Further, in an exemplary embodiment, the side of the heat source plate which is far away from the conversion device is provided with a rough structure for the heat generation by friction.

Further, in an exemplary embodiment, the heat source plate is made of a heat conductive material.

In an exemplary embodiment, the mobile communication terminal is a cell phone.

Further, in an exemplary embodiment, the thermoelectric conversion unit is arranged at the back cover of the cell phone.

Since there is a thermoelectric conversion unit in the mobile communication terminal of the present disclosure, the heat energy can be converted into electric energy to supply power for the mobile communication terminal. Therefore, the mobile communication terminal of the present disclosure can take full advantage of energy, has long continuous service time, and is convenient to use.

DETAILED DESCRIPTION

In order for those skilled in the art to better understand the technical solutions of the present disclosure, detailed descriptions are further made to specific implementations of the present disclosure in connection with the figures below.

First Embodiment

Figure 1:
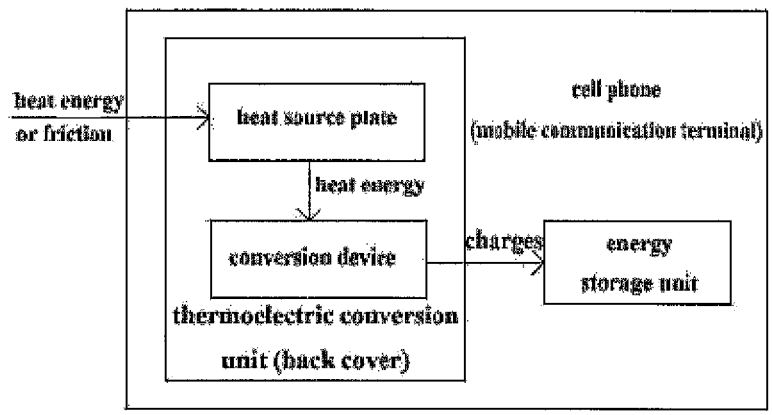
FIG. 1 is a schematic block diagram of a configuration of a mobile communication terminal according to a first embodiment of the present disclosure.
Figure 2:
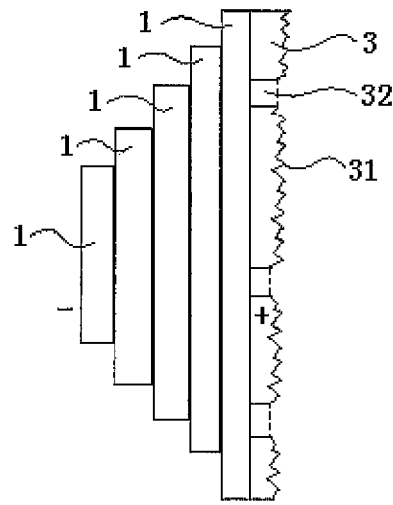
FIG. 2 is a schematic diagram of a structure of a thermoelectric conversion unit of the mobile communication terminal according to the first embodiment of the present disclosure.
Figure 3:
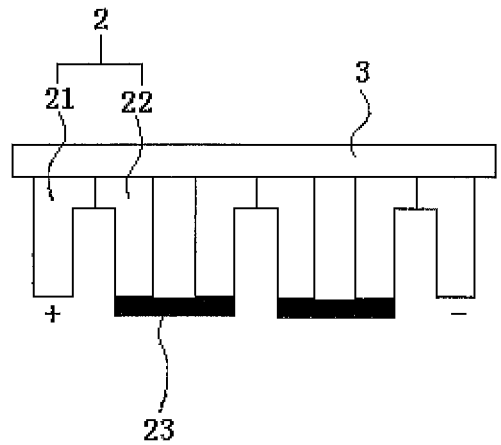
FIG. 3 is a schematic diagram of a structure of another thermoelectric conversion unit of the mobile communication terminal according to the first embodiment of the present disclosure.

As shown in FIG. 1 to FIG. 3, the embodiment provides a mobile communication terminal.

For example, the mobile communication terminal can be a cell phone, and this embodiment is described by taking a cell phone as an example of the mobile communication terminal. However, it should be understood that the mobile communication terminal can also be other mobile devices having communication function, such as a tablet computer or the like.

The mobile communication terminal comprises known components such as a display panel, a speaker, a microphone, a processor, a circuit board, a housing, keys, and so on. In addition, it also comprises a thermoelectric conversion unit and an energy storage unit.

The thermoelectric conversion unit is configured to convert heat energy into electric energy. The thermoelectric conversion unit comprises a conversion device for converting heat energy into electric energy. The energy storage unit is electrically connected to the conversion device, and it is configured to store the electric energy generated by the conversion device, and supply power for other components (such as the processor, the display panel, the speaker, and so on) of the mobile communication terminal.

In other words, the mobile communication terminal of the embodiment can convert heat energy, such as heat energy generated by friction, heat energy in the environment, the heat energy generated by the mobile communication terminal itself, and so on, into electric energy through the thermoelectric conversion unit, and store the electric energy in the energy storage unit, so as to provide part of the energy required by the operation of the mobile communication terminal. In such a way, it is possible to take full advantage of energy and extend the continuous service time of the mobile communication terminal.

The energy storage unit can be the original battery of the mobile communication terminal, that is, the thermoelectric conversion unit can charge the battery at any time. Alternatively, the energy storage unit can be an additional auxiliary battery, in other words, the mobile communication terminal is mainly powered by its original battery, but as a complement, the auxiliary battery can supply power for the mobile communication terminal when the original battery has insufficient amount of electricity, or supply power for some low power consumption components.

FIG. 2 illustrates a schematic diagram of a structure of a thermoelectric conversion unit of the mobile communication terminal according to the first embodiment of the present disclosure. As shown in FIG. 2, as one implementation of this embodiment, the conversion device comprises a plurality of superposed carbon nano-tube films 1, and the areas of the carbon nano-tube films 1 become smaller gradually in the direction perpendicular to the surfaces of the carbon nano-tube films.

In other words, the conversion device can comprise a plurality of superposed carbon nano-tube films 1, and the areas of these carbon nano-tube films 1 become smaller gradually (obviously, they become larger gradually in view of the opposite direction) such as to form "step-shape" carbon nano-tubes. The carbon nano-tube is a thermoelectric conversion material. When the carbon nano-tubes form the above "step" structure, a electrical potential difference will be generated between the films at the two ends (i.e., the positions represented by the positive sign and the negative sign in the figure) as long as hot airflow passes between the carbon nano-tubes in respective layers and the carbon nano-tubes have temperature difference. It is possible to charge the energy storage unit as long as the electrodes (not shown in the figure) of the energy storage unit are connected to the films at the two ends.

For example, as shown in FIG. 2, the thermoelectric conversion unit can further comprises a heat source plate in contact with the outermost carbon nano-tube film, and the heat source plate is configured to transfer heat energy to the conversion device.

When the thermoelectric conversion is performed by the carbon nano-tube films 1, the amount of the generated electricity is in close relationship with the magnitude of temperature difference between the carbon nano-tube films 1. Obviously, in practical applications, it is not possible to cool the carbon nano-tube films 1 specially and thus the temperature difference should be increased by increasing the temperature at one end of the carbon nano-tube films 1. For this, it is possible to arrange a heat source plate 3 for transferring heat energy to the outermost carbon nano-tube film 1 (that is the carbon nano-tube film 1 with the largest area or the smallest area) to increase the temperature difference.

Further, as an implementation of the embodiment, as shown in FIG. 2, the side of the heat source plate which is far away from the conversion device is provided with a rough structure 31 for heat generation by friction.

In other words, it is possible to form a surface with high roughness (e.g., with large amount of micro caves or micro bumps) on the side (or referred to as outer side) of the heat source plate 3 which is far away from the conversion device by hot press molding and machining. As such, when the user rubs the surface, a lot of heat energy can be generated by frictional heat generation and transferred to the conversion device, and then be used to generate electrical energy through the thermoelectric conversion.

Further, as another implementation of the embodiment, the heat source plate 3 can also be made of a heat conductive material.

In other words, the heat source plate 3 can have no rough structure 31 thereon, but it is made of a material with good heat conductive performance (such as Aluminum). In such a way, when the outer side of the heat source plate 3 is in contact with a heat source, the heat source plate 3 can transfer the heat energy to the conversion device. For example, the heat source can be other components with high temperature in the cell phone (such as the processor, that is, using the spare heat dissipated by the processor to supply heat energy to the conversion device), or can be an external heat source (such as a human body, that is, using the temperature of the human body to supply heat energy to the conversion device).

Further, openings 32 for airflow passing through are provided on the heat source plate 3.

For the carbon nano-tube films 1, when they perform thermoelectric conversion, if there is hot airflow flowing through the film surfaces, the conversion efficiency can be improved. For this purpose, as shown in FIG. 2, it is arranged on the heat source plate 3 openings 32 (e.g., micro holes) for airflow passing through so as to generate hot airflow flowing through each carbon nano-tube films.

For example, when there is the heat source plate 3, the above conversion device can be fabricated by the following method. Ultra-violet curing glue or thermo-curing glue is coated on the heat source plate 3, and then pre-baked. After that, an electrode (e.g., anode) is formed on the heat source plate 3, and then a plurality of carbon nano-tube films 1 with different areas are fabricated in sequence by film drawing mode. Thereafter, ultra violet irradiation or hot baking is performed to cure the glue and the carbon nano-tube films 1 on it. Finally, another electrode (e.g., cathode) is formed to transfer electric energy to the energy storage unit. However, this fabrication approach is only one specific example of the fabrication methods of the above conversion device, and does not limit the fabrication method of the conversion device.

FIG. 3 illustrates a schematic diagram of structure of another thermoelectric conversion unit of the mobile communication terminal according to the first embodiment of the present disclosure. As another mode of the embodiment, the conversion device can also comprise at least one thermoelectric generation device 2, each of which comprises a first material 21 and a second material 22 electrically connected at one end. The first material 21 and the second material 22 are materials that can generate Seebeck effect.

In other words, as shown in FIG. 3, the two different materials (preferably semiconductor materials) can be electrically connected at one end to form a thermoelectric generator 2. As such, based on the Seebeck effect, as long as the temperature at the electrically connected ends of the two materials goes up, electric potential difference can be generated at the other ends of the two materials. As long as the electrodes (not shown in the figure) of the energy storage unit are connected to the other ends of the two materials, the energy storage unit can be charged. The first material 21 and the second material 22 that can constitute the thermoelectric generator 2 are various and known, which are not described in detail here.

Of course, in practical applications, it can be as shown in FIG. 3, a plurality of thermoelectric generators 2 are arranged simultaneously, and the other ends (not the electrically connected ends) of the first material 21 and the second material 22 of different thermoelectric generators 2 are connected through conductors 23, which is equivalent to that a plurality of thermoelectric generators 2 are connected in series so as to provide larger output of electrical potential difference between the positions represented by the positive sign and the negative sign in the figure, for raising electricity generation efficiency.

As shown in FIG. 3, when the conversion device is the thermoelectric generator, the above-mentioned heat source plate 3 can also be arranged, which can be in contact with the electrically connected ends of the first material 21 and the second material 22 in the thermoelectric generator 2, so as to conduct heat energy to these ends to raise their temperature.

For example, the heat source plate 3 can be the above-described heat source plate 3 with the rough structure 31, or can be the above-described heat source plate 3 made of a heat conductive material, as long as it can transfer heat energy to the electrically connected ends of the first material 21 and the second material 22 in each thermoelectric generator 2.

For example, the above thermoelectric conversion unit is arranged at the back cover of the cell phone.

Obviously, the electricity generation efficiency of the thermoelectric conversion unit is in close relationship with the amount of heat energy it receives, and given a certain temperature, larger area of the thermoelectric conversion unit can receive more heat energy. On the cell phone, the back cover opposite to the display panel is usually a larger and relatively flat face, and it usually does not contain other components, and thus it can be a good platform for arranging the thermoelectric conversion unit. For example, the above heat source plate 3 can be used as the back cover of the cell phone, and the above-described conversion unit (carbon nano-tube film 1 or thermoelectric generator 2) is arranged on its inner side.

It can be understood that the above implementations are only exemplary implementations adopted for illustrating the principle of the present disclosure, but the present disclosure is not limited to that. Those skilled in the art can make various variations and improvements without departing from the spirit and essence of the present disclosure. These variations and improvements are also intended to be incorporated within the protection scope of the present disclosure.

The present application claims the priority of Chinese Patent Application No. 201310703483.7 filed on Dec. 19, 2013, entire content of which is incorporated as part of the present invention by reference.

What is claimed is:

1. A mobile communication terminal comprising:
a thermoelectric conversion unit comprising a conversion device for converting heat energy into electric energy; and
an energy storage unit electrically connected to the conversion device and configured to store the electric energy generated by the conversion device, wherein the conversion device comprises a plurality of superposed carbon nano-tube films, and areas of the carbon nano-tube films become smaller gradually in a direction perpendicular to surfaces of the carbon nano-tube films.

2. The mobile communication terminal according to claim 1, wherein the thermoelectric conversion unit further comprises:
a heat source plate in contact with an outermost carbon nano-tube film, and configured to transfer heat energy to the conversion device.

3. The mobile communication terminal according to claim 2, wherein
openings for airflow passing through are provided on the heat source plate.

4. The mobile communication terminal according to claim 1, wherein the conversion device comprises:
at least one thermoelectric generator, each of which comprises a first material and a second material electrically connected at one end, wherein the first material and the second material are materials that can generate Seebeck effect.

5. The mobile communication terminal according to claim 4, wherein the thermoelectric conversion unit further comprises:
a heat source plate in contact with the electrically connected ends of the first material and the second material in the thermoelectric generator, and configured to transfer heat energy to the conversion device.

6. The mobile communication terminal according to claim 2, wherein
a side of the heat source plate which is far away from the conversion device is provided with a rough structure for heat generation by friction.

7. The mobile communication terminal according to claim 2, wherein
the heat source plate is made of a heat conductive material.

8. The mobile communication terminal according to claim 1, wherein
the mobile communication terminal is a cell phone.

9. The mobile communication terminal according to claim 8, wherein
the thermoelectric conversion unit is arranged at the back cover of the cell phone.

10. The mobile communication terminal according to claim 3, wherein
a side of the heat source plate which is far away from the conversion device is provided with a rough structure for heat generation by friction.

11. The mobile communication terminal according to claim 5, wherein
a side of the heat source plate which is far away from the conversion device is provided with a rough structure for heat generation by friction.

12. The mobile communication terminal according to claim 3, wherein
the heat source plate is made of a heat conductive material.

13. The mobile communication terminal according to claim 5, wherein
   the heat source plate is made of a heat conductive material.

14. The mobile communication terminal according to claim 8, wherein
   the conversion device comprises a plurality of superposed carbon nano-tube films, and areas of the carbon nano-tube films become smaller gradually in a direction perpendicular to surfaces of the carbon nano-tube films.

15. The mobile communication terminal according to claim 14, wherein the thermoelectric conversion unit further comprises:
   a heat source plate in contact with an outermost carbon nano-tube film, and configured to transfer heat energy to the conversion device.

16. The mobile communication terminal according to claim 15, wherein
   openings for airflow passing through are provided on the heat source plate.

17. The mobile communication terminal according to claim 8, wherein the conversion device comprises:
   at least one thermoelectric generator, each of which comprises a first material and a second material electrically connected at one end, wherein the first material and the second material are materials that can generate Seebeck effect.

18. The mobile communication terminal according to claim 17, wherein the thermoelectric conversion unit further comprises:
   a heat source plate in contact with the electrically connected ends of the first material and the second material in the thermoelectric generator, and configured to transfer heat energy to the conversion device.

* * * * *